(12) United States Patent
Yamamoto et al.

(10) Patent No.: US 7,792,160 B2
(45) Date of Patent: Sep. 7, 2010

(54) COHERENT LIGHT SOURCE AND RECORDING AND REPRODUCTION DEVICE USING THE SAME

(75) Inventors: Kazuhisa Yamamoto, Osaka (JP); Kenichi Kasazumi, Osaka (JP); Tomoya Sugita, Nara (JP); Tetsuro Mizushima, Osaka (JP); Shinichi Kadowaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 89 days.

(21) Appl. No.: 11/661,314

(22) PCT Filed: Feb. 17, 2006

(86) PCT No.: PCT/JP2006/302812

§ 371 (c)(1),
(2), (4) Date: Nov. 17, 2008

(87) PCT Pub. No.: WO2006/092965

PCT Pub. Date: Sep. 8, 2006

(65) Prior Publication Data

US 2009/0080466 A1    Mar. 26, 2009

(30) Foreign Application Priority Data

Mar. 2, 2005  (JP) .............................. 2005-057791

(51) Int. Cl.
*H01S 3/30* (2006.01)
*H01S 3/08* (2006.01)

(52) U.S. Cl. ............................ 372/5; 372/101; 372/102; 372/103

(58) Field of Classification Search ................ 372/5, 372/101, 102, 103
See application file for complete search history.

(56) References Cited

U.S. PATENT DOCUMENTS

| 5,764,663 A | 6/1998 | Ouchi et al. |
| 2002/0061033 A1 | 5/2002 | Kitaoka et al. |

FOREIGN PATENT DOCUMENTS

| JP | 1-200734 | 8/1989 |
| JP | 3-160692 | 7/1991 |
| JP | 4-371988 | 12/1992 |
| JP | 6-59383 | 3/1994 |
| JP | 9-152640 | 6/1997 |
| JP | 11-340126 | 12/1999 |
| JP | 2000-138411 | 5/2000 |
| JP | 2002-204023 | 7/2002 |
| WO | 96/38757 | 12/1996 |
| WO | 03/048869 | 6/2003 |

*Primary Examiner*—Armando Rodriguez
(74) *Attorney, Agent, or Firm*—Wenderoth, Lind & Ponack, L.L.P.

(57) ABSTRACT

For performing hologram recording or reproduction, an oscillation wavelength half value width $\Delta\lambda$ of a coherent light source satisfies a relationship of $\Delta\lambda < \lambda^2/(S \times 2 \sin\theta)$, where a substantial hologram size is S, a substantial cross angle between reference light and signal light is $\theta$, and the oscillation wavelength of the coherent light source is $\lambda$. Even when stray light is generated, the coherent light source can suppress generation of an unnecessary interference fringe due to the stray light, and stably record and reproduce holograms.

17 Claims, 11 Drawing Sheets

FUNDAMENTAL WAVE
SPECTRUM
(WAVELENGTH)

COHERENT LIGHT SOURCE AND RECORDING AND REPRODUCTION DEVICE USING THE SAME

TECHNICAL FIELD

The present invention relates to a device suitable for use in the field of optical information that performs hologram recording by using coherent light.

BACKGROUND ART

Figure 10:
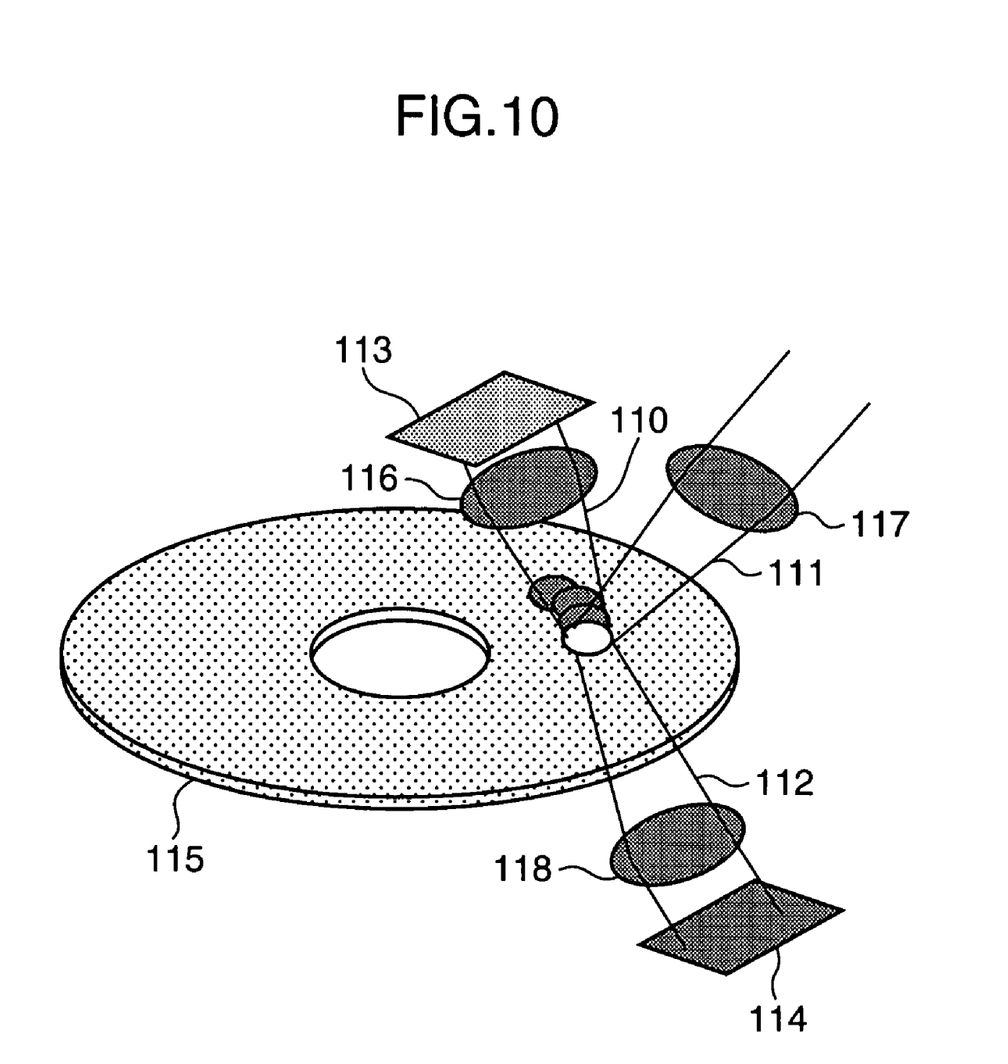
FIG. 10 is a schematic diagram of a structure of a hologram recording and reproduction device based on conventional art.

For realizing higher density optical discs and a higher accuracy of optical measurement, a short wavelength light source of a small size is necessary. Particularly, a recording and reproduction method using holograms has been drawing attention as a high density optical disc of a next generation since a recording density of around 100 Gbit/inch$^2$ may be achieved. FIG. 10 is a schematic diagram showing a structure of a holographic optical information recording and reproduction device which has been proposed conventionally. The recording and reproduction device uses an optical disc optical system of a shift multiplex recording mode.

A laser beam emitted from a laser light source (not shown) as a coherent light source is split into two. Then, one beam passes through a space light modulator (hereinafter, referred to as "SLM") 113, and is converged to a hologram recording medium 115 with a Fourier transformation lens 116 to become a signal light 110. The other split beam is converted to have an appropriate beam diameter by a converging lens 117, and is applied as reference light 111 to a position the same as that of the signal light 110 in the hologram recording medium 115. The hologram recording medium 115 has a structure such that a hologram medium such as photopolymer is sealed between two glass substrates. An interference fringe of the signal light 110 and the reference light 111 is recorded. For reproducing the recorded signal, only the reference light 111 is applied to the hologram recording medium 115. Diffracted reproduction light 112 from the hologram passes through a Fourier transformation lens 118, and is received by a CCD element 114.

In the recording and reproduction device using holograms, angular multiplex recoding can be performed since the thickness of the hologram recording medium 115 is as thick as about 1 mm, and the interference fringe is recorded as a thick grating, a so-called Bragg grating. In the recording and reproduction device of FIG. 10, angular multiplex is realized by shifting the position to which a spherical wave reference light 111 is applied, instead of changing an incident angle of the reference light 111 for shift multiplex recording. More specifically, the hologram recording medium 115 is rotated by a small amount within the plane, and a recording position is shifted. The incident angle of the reference light 111 sensed by each part of the hologram medium is changed slightly. In this way, multiplex recording is performed.

When the thickness of the hologram medium is 1 mm, angular selectivity defined by reproduction signal intensity is 0.014 degrees at the full width at half maximum. When NA of the reference light is 0.5, multiplex of the holograms can be realized in intervals of about 20 µm. The recording density is 200 Gbits/inch$^2$, which is 300 GB when it is converted to the capacity of a 12 cm disc.

The Bragg grating has angular selectivity and also has wavelength selectivity. Thus, it becomes necessary to control the wavelength of the light source when recording or reproduction is performed. The wavelength selectivity in the grating for this hologram medium is 0.2 nm.

For realizing such a high density optical information recording and reproduction device as described above, a small and stable laser light source and a recording medium which allows multiplex recording are important.

Figure 11:
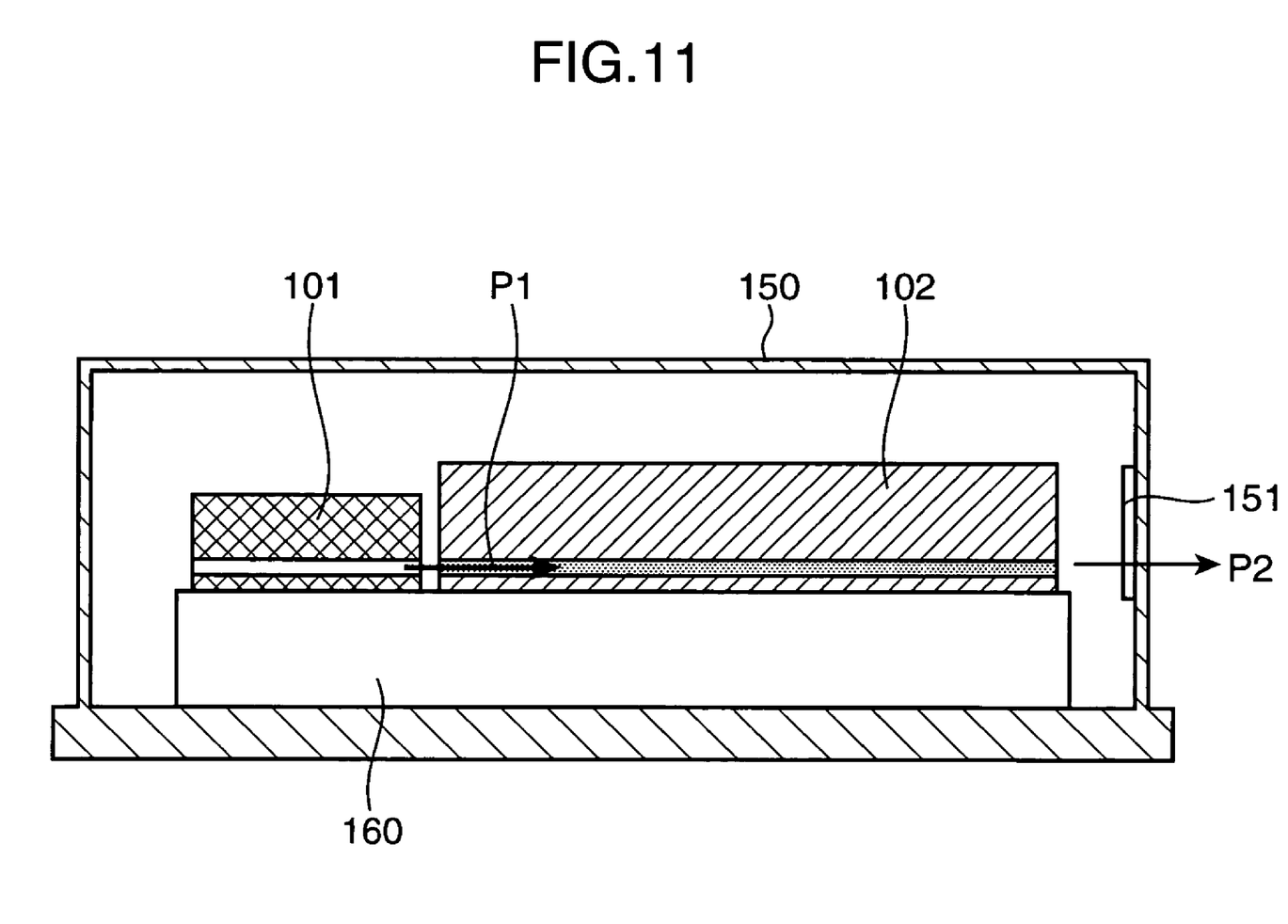
FIG. 11 is a schematic diagram of a structure of a SHG blue light source using an SHG device based on conventional art.

FIG. 11 is a schematic diagram showing a structure of an SHG blue light source using a light guide QPM-SHG device, which is a typical stable light source (see Japanese Laid-Open Publication No. 2002-204023). As shown in FIG. 11, a DBR semiconductor laser of a wavelength variable type which has a distribution Bragg reflector (hereinafter, referred to as "DBR") area is used as a semiconductor laser 101. The wavelength variable DBR semiconductor laser 101 is a 100 mW class wavelength variable DBR semiconductor laser of AlGaAs with a wavelength of 850 nm. The wavelength variable DBR semiconductor laser 101 is formed of an active layer area, a phase adjustment area, and a DBR area. By changing electrical currents flowing into the phase adjustment area and the DBR area at the same time, an oscillation wavelength can be changed continuously.

A fundamental wave P1 from the semiconductor laser 101 is transformed to have half the wavelength in an SHG device 102 which can convert the wave length, and is output as higher harmonic wave P2. The semiconductor laser 101 and the SHG device 102 are fixed on a sub-mount 160, and they are incorporated within a package 150. The higher harmonic wave P2 having the wavelength of 425 nm passes through a window 151 of the package 150 and is taken outside.

As described above, in the recording and reproduction device using holograms, the diffraction pattern to be recorded varies depending upon the directions of incidence of the light, and/or wavelengths. If the wavelength of the light for recording and that of the light for reproduction are different, cross talk signal may increase, and/or intensity of the signal light may decrease.

Information of the hologram recording medium 115 is reproduced as Bragg diffraction light from the recorded interference fringe. For reproducing the information of the hologram recording medium 115 with a sufficient amount of light, Bragg conditions have to be satisfied. The incident angle of the reference light beam with respect to the hologram medium and the wavelength of the reference light beam have to be respectively adjusted to optimal values.

For example, when a system in which the thickness of the hologram medium is 1 mm, the wavelength of the light source is 515 nm, and the interval of the interference fringe is 0.5 µm in the system is assumed, a range of permissible values of the Bragg conditions for the wavelength of the reference light beam, which is defined by a value of the wavelength where diffraction efficiency is reduced by half, is 515±0.2 nm.

In the recording and reproduction device using holograms, a hologram is recorded by the interference of the signal light and the reference light. Thus, when a stray light, which is unnecessary reflected light, is generated in the optical system, the stray light generates unnecessary interference fringe, and holograms cannot be recorded or reproduced stably. In such a case, it is possible to provide a precise optical system on a shock resistant table or the like to eliminate such stray light. However, this increases the size of the recording and reproduction device, and a small recording and reproduction device cannot be achieved.

DISCLOSURE OF THE INVENTION

An object of the present invention is to provide a coherent light source which can stably record and reproduce holograms even when stray light is generated by restricting generation of unnecessary interference fringe due to the stray light, and a small recording and reproduction device using the same.

A coherent light source according to one aspect of the present invention has an oscillation wavelength half value width $\Delta\lambda$ which satisfies a relationship of $\Delta\lambda > \lambda^2/2t$ for performing recording or reproduction of a hologram, when an optical path length of a hologram recording optical system is t, and an oscillation wavelength of the coherent light source is $\lambda$.

A recording and reproduction device according to another aspect of the present invention includes a coherent light source as described above and an optical system for converging light emitted from the coherent light source on a hologram recording medium.

With the above structures, holograms can be stably recorded and reproduced even when stray light is generated by restricting generation of unnecessary interference fringe due to the stray light, and a small recording and reproduction device can be achieved.

BEST MODE FOR CARRYING OUT THE INVENTION

Embodiment 1

Figure 1:
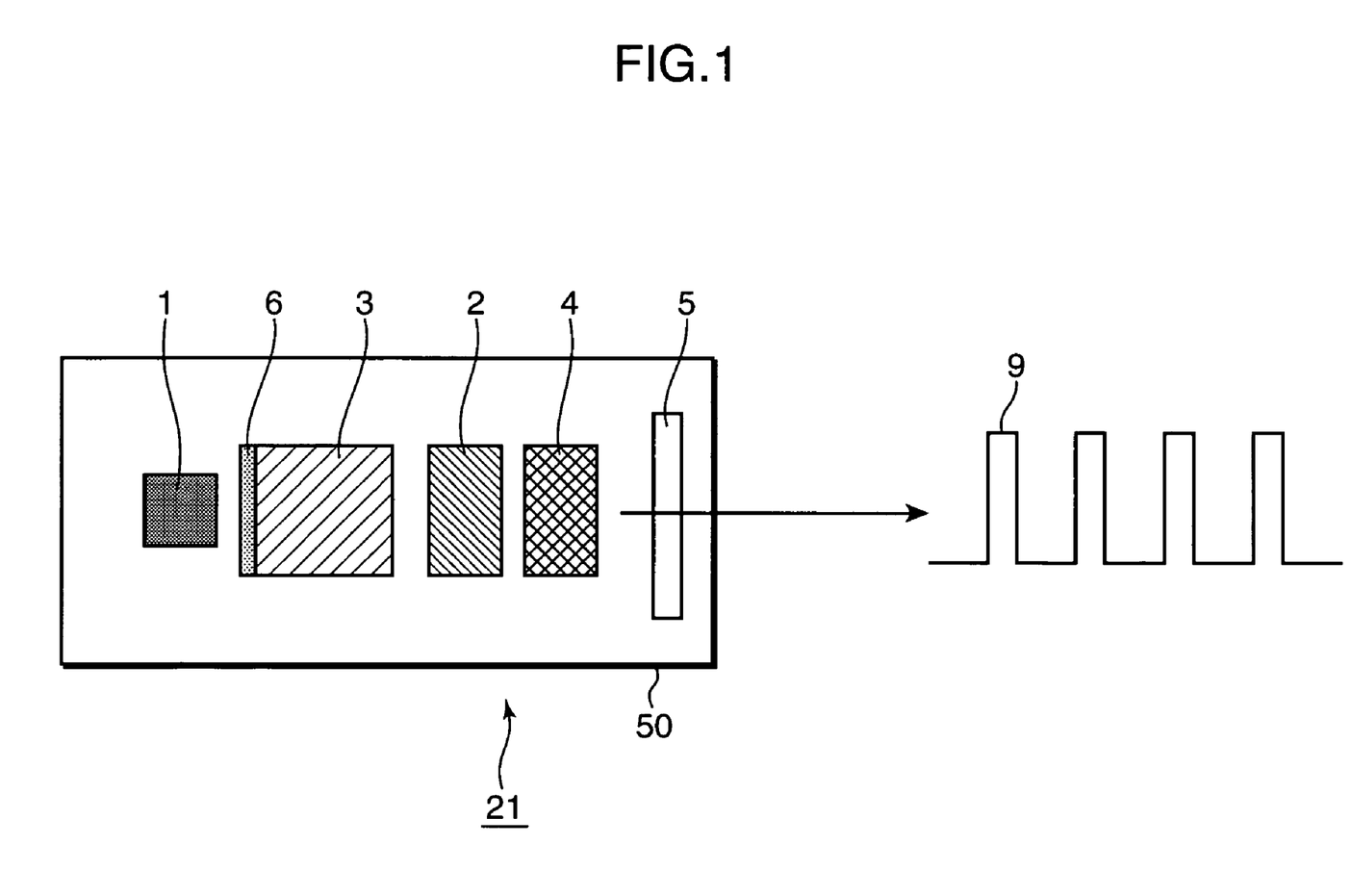
FIG. 1 is a schematic diagram showing a structure of a coherent light source used in a recording and reproduction device according to Embodiment 1 of the present invention.

FIG. 1 is a schematic diagram showing a structure of a coherent light source used for a recording and reproduction device according to Embodiment 1 of the present invention. As shown in FIG. 1, a coherent light source 21 employs a semiconductor laser 1 of AlGaAs with an output of 1 W and a wavelength of 810 nm as an excitation light source. A solid laser 3 used as a light source for generating fundamental wave uses Nd-added YAG (Nd:YAG). A solid laser light excited by the semiconductor has its wavelength transformed by an SHG (second harmonic generation) device 2 and is used as a light source.

As the SHG device having a wave transformation function, a bulk-type SHG device 2 of a quasi phase matching (hereinafter, referred to as "QPM") type is used. The SHG device 2 can use a large nonlinear optical constant by quasi phase matching. Further, the SHG device 2 is a light guide which allows a long interactive length. Thus, high transformation efficiency can be achieved. The SHG device 2 is formed of periodic polarization reversed areas formed on an $LiNbO_3$ substrate doped with MgO. The periodic polarization reversed areas are created by forming an electrode of a comb shape on MgO dope of Z plate and applying an electric field.

The semiconductor laser 1 is connected to the solid laser 3. The SHG device 2 is placed within the resonator by the solid laser 3. The resonator is formed by a reflective film 6, which is vapor-deposited to the solid laser 3, and a mirror 5. The mirror 5 is coated with a nonreflective coating with respect to an SHG output 9. Also, a saturable absorber 4 of Cr:YAG is inserted into the resonator. The saturable absorber 4 automatically causes a Q switching operation. The Q switching operation controls the wavelength width. The above light sources are incorporated within the package 50, and the temperature is controlled by a Peltier element. The solid laser oscillates within the resonator an output of the semiconductor laser 1 of 1 W, and SHG light on an average of 150 mW is extracted.

The oscillation wavelength of the solid laser is constant, and is fixed to a phase matching wavelength of 532.1 nm of the SHG device 2. By using the coherent light source 21, green light of the wavelength of 532.1 nm is obtained at an average output of about 150 mW. A repetition frequency at output of a pulse is 1.5 kHz, and the peak output is 75 W. Further, by selecting an oscillation line of 1064.2 nm of the solid laser, the wave length can be stabilized to 1064.2 nm. The oscillation wavelength can be fixed to a desired wavelength within a range of permissible values of phase matching wavelength of the SHG device 2, which is a wavelength transformation element. A wavelength of higher harmonic light becomes completely stabilized to 532.1 nm.

Figure 2:
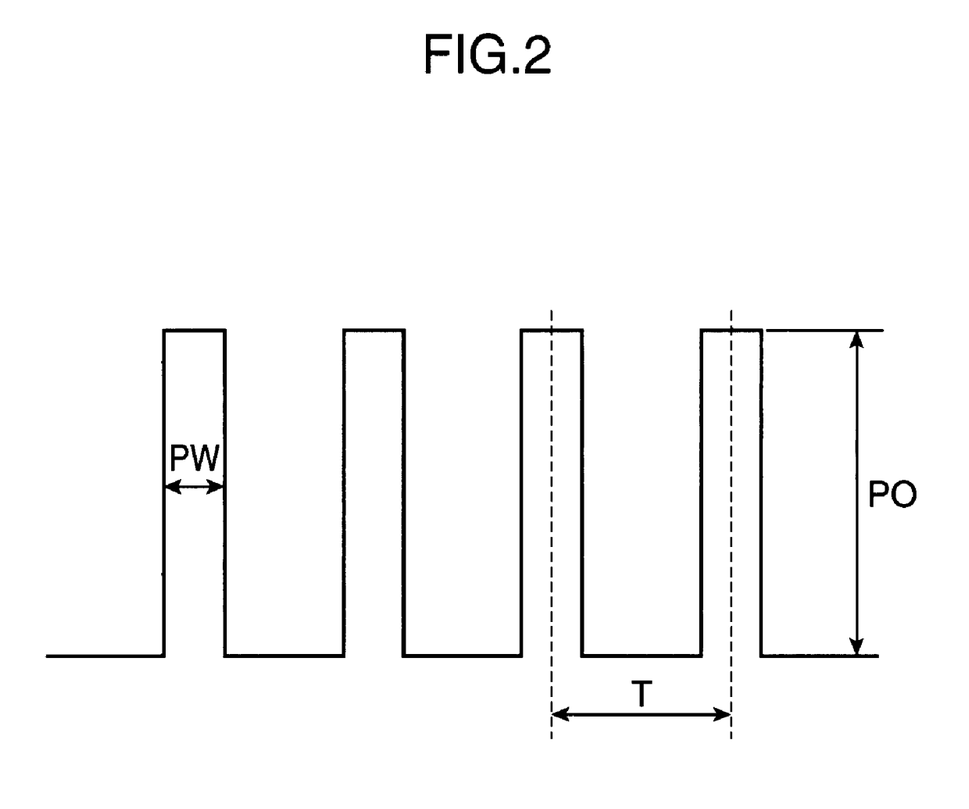
FIG. 2 is a schematic diagram showing pulses generated from the coherent light source shown in FIG. 1.

As shown in FIG. 2, a pulse width PW of the SHG output 9 is defined by a full width at half maximum, and is 0.7 µs. A pulse peak output PO is 75 W. The repetition frequency (1/repetition time T) is 1.5 kHz. An oscillation wavelength half value width $\Delta\lambda$ is 0.05 nm. Under such conditions, power of the SHG output 9 is 70 µJ. After it passes through an optical head formed of the optical system, a laser beam can irradiate the hologram recording medium at 10 µJ.

Figure 3:
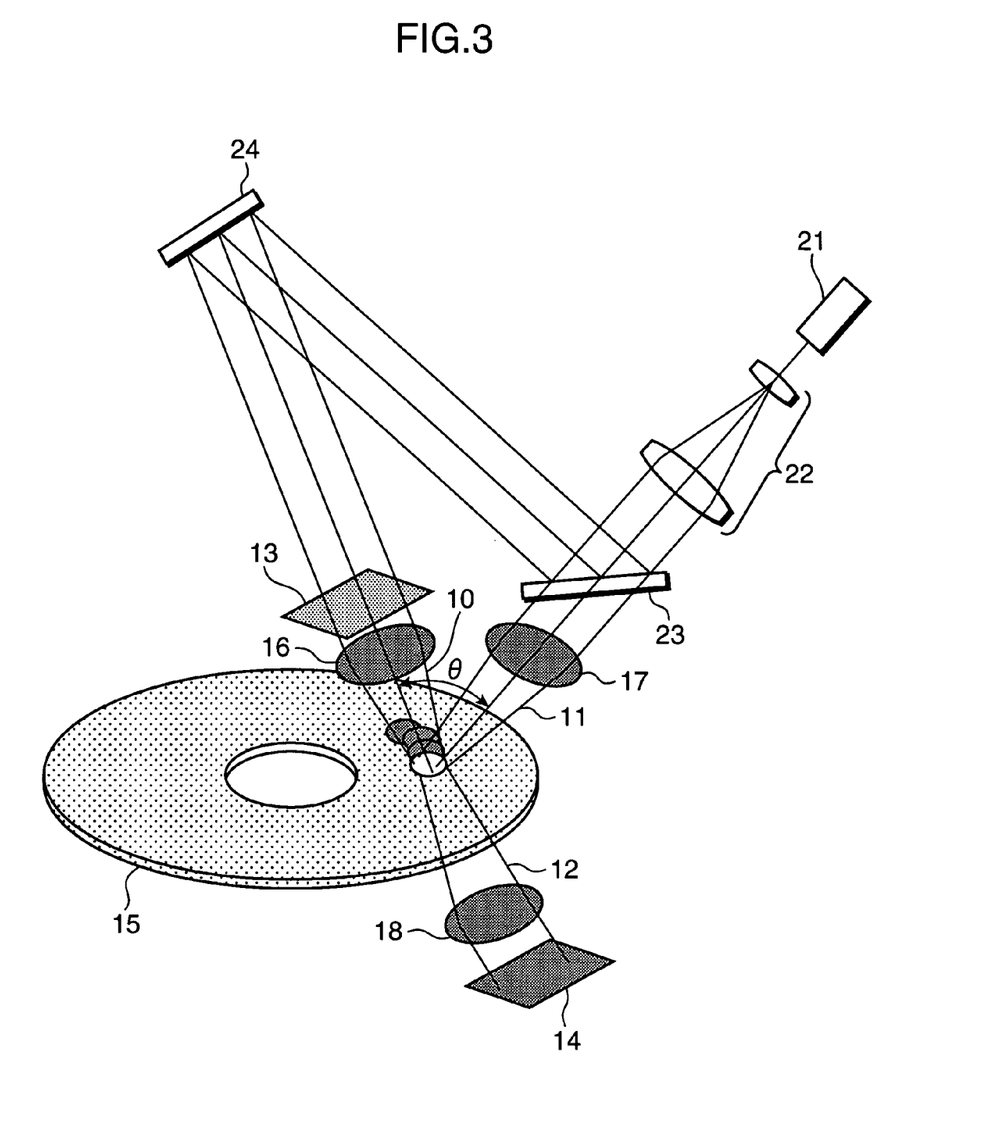
FIG. 3 is a schematic diagram showing a structure of the recording and reproduction device according to Embodiment 1 of the present invention.

FIG. 3 shows a recording and reproduction device according to Embodiment 1 of the present invention. The recording and reproduction device employs the coherent light source 21 shown in FIG. 1 as a laser light source, and uses an optical disc optical system of shift multiplex recording mode. The laser beam emitted from the coherent light source 21 has its beam diameter extended by a beam expander 22, and is split by a half mirror 23. One of the split beams is reflected off a mirror 24, passes through a space light modulator (hereinafter, referred to as "SLM") 13, and is converged to a hologram recording medium 15 with a Fourier transformation lens 16 to become a signal light 10. The other split beam is converted to have an appropriate beam diameter by a converging lens 17, and is applied as reference light 11 to a position the same as that of the signal light 10 in the hologram recording medium 15. The hologram recording medium 15 has a structure such that a hologram medium such as photopolymer is sealed between two glass substrates. An interference fringe of the signal light 10 and the reference light 11 is recorded. The above-mentioned components and the like form a hologram recording optical system.

The SLM 13 is formed of optical switch arrays which are aligned two dimensionally. Each of the optical switches is turned on and off independently in response to the input signal to be recorded. For example, when an SLM including 1024 rows and 1024 columns of cells is used, information of 1 Mbits can be displayed at the same time. The information of 1 Mbits displayed on the SLM 13 when the signal light 10 passes through the SLM 13 is transformed into two dimensional optical beam arrays and is recorded on the hologram recording medium 15 as the interference fringe. For reproducing the recorded signal, only the reference light 11 is applied to the hologram recording medium 15. Diffracted light from the hologram is received by a CCD element 14 as the reproduction light 12. The above-mentioned components and the like form an optical system which serves as an optical head.

In an optical recording system using holograms, angular multiplex recoding can be performed since the thickness of the hologram recording medium 15 is as thick as about 1 mm, and the interference fringe is recorded as a thick grating, a so-called Bragg grating. In the recording and reproduction device of FIG. 3, angular multiplex is realized by shifting the position to which a spherical wave reference light 11 is applied, instead of changing an incident angle of the reference light 11 for shift multiplex recording. More specifically, the hologram recording medium 15 is rotated by a small amount within the plane, and a recording position is shifted. The incident angle of the reference light 111 sensed by each part of the hologram medium is changed slightly. In this way, multiplex recording is performed.

When the thickness of the hologram medium is 1 mm, selectivity of the angle defined by reproduction signal intensity is 0.014 degrees at the full width at half maximum. When NA of the reference light is 0.5, multiplication of the hologram can be realized at an interval of about 20 μm. The recording density is 200 Gbits/inch$^2$, which is 300 GB when converted to the capacity of a 12 cm disc.

For performing hologram recording and reproduction, it is preferable that the oscillation wavelength half value width $\Delta\lambda$ of the coherent light source 21 has the relationship which satisfies $\Delta\lambda < \lambda^2/(S \times 2 \sin\theta)$ when a substantial hologram size is S, a substantial cross angle between the reference light 11 and the signal light 10 is $\theta$, and the oscillation wavelength of the coherent light source 21 is $\lambda$. The reasons will be described below.

When the substantial hologram size is S, the substantial cross angle between the reference light and the signal light is $\theta$, and the wavelength is $\lambda$, the interference fringe interval $\Lambda$ satisfies the equation, $\Lambda = \lambda/2 \sin\theta$, and the optical path difference d satisfies the equation, $d = S/\Lambda \times \lambda$. Herein, it is desirable that the coherent length L of the coherent light source is larger than the optical path difference d. Since L is $\lambda^2/\Delta\lambda$, $S/\Lambda \times \lambda < \lambda^2/\Delta\lambda$. It is desirable that the equation, $\Delta\lambda < \lambda^2/(S \times 2 \sin\theta)$, is satisfied. Under such conditions, interference fringe by the signal light and the reference light can be stably recorded, and holograms can be recorded securely. In this embodiment, the hologram size S is 3 mm, the wavelength $\lambda$ is 532 nm, and the cross angle $\theta$ is 30 degrees. Thus, the oscillation wavelength half value width $\Delta\lambda$ has to be 0.1 nm or shorter.

Figure 4:
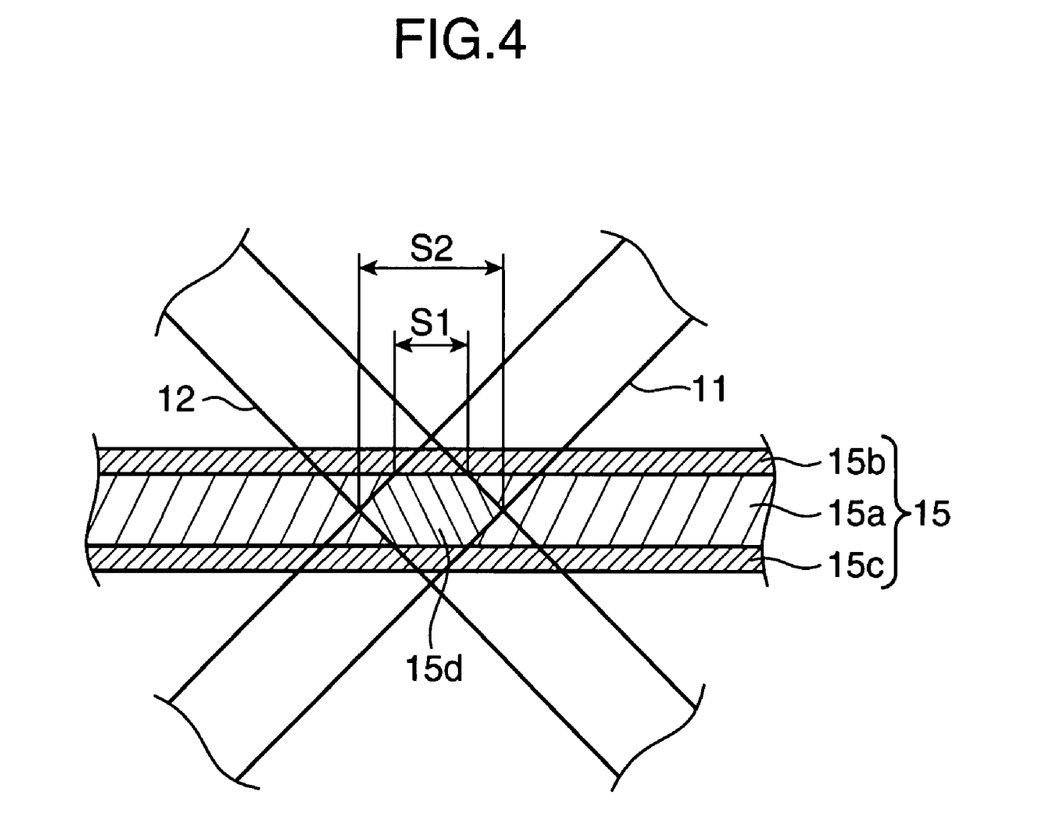
FIG. 4 is a schematic diagram for illustrating a substantial hologram size.

The substantial hologram size S as mentioned above is a diameter of a transmission hole when the reference light and the signal light are applied to the hologram recording medium 15 through a light shielding plate with a predetermined transmission hole. Further, as shown in FIG. 4, when the reference light 11 and the signal light 10 are applied to the hologram recording medium 15 formed by sealing a hologram medium 15a by two glass substrates 15b and 15c and a hologram 15d is recorded, a length 51 of sides of the hologram 15d abutting the glass substrates 15b and 15c is the substantial hologram size S. The substantial hologram size S is not limited to the above example. A length S2 of a central portion of the hologram 15 may be the substantial hologram size S, or an average length of S1 and S2, (S1+S2)/2, may be the substantial hologram size S.

On the other hand, when an optical path length of the hologram recording optical system is t, a coherent light source which satisfies $\Delta\lambda > \lambda^2/2t$ is effective. This is because, for having a sufficiently small Bragg width when reproduction is performed, the coherence length L not longer than twice the optical path length t is desirable. In such a case, unnecessary interference fringe due to unnecessarily reflected light is not generated. A signal can be reproduced with few noises. Further, it is no longer necessary to use special large equipment such as a shock resistant mount. Thus, a small recording and reproduction device can be achieved. Moreover, even when a laser beam satisfying the above conditions is used as a curing beam, no interference fringe is generated.

The above-described condition leads to a light source which satisfies $L < 2t$, $\Delta\lambda > \lambda^2/2t$. In this embodiment, the optical path length t of the hologram recording optical system is 15 mm. Thus, the oscillation wavelength half value width $\Delta\lambda$ is 0.01 nm or higher. The optical path length t of the hologram recording optical system refers to a value obtained by adjusting a length between a position where laser light impinges into each of lens portions and a position where a laser light is emitted by using an internal refractive index.

Two conditions as mentioned above show that it is preferable that the oscillation wavelength half value width $\Delta\lambda$ satisfies the relationship of $\lambda^2/2t < \Delta\lambda < \lambda^2/(S \times 2 \sin\theta)$. In this way, the interference fringe of the signal light and the reference light can be stably recorded. Further, unnecessary interference fringe due to unnecessary reflected light is not generated. Thus, the hologram can be recorded and reproduced stably. In this embodiment, the oscillation wavelength half value width $\Delta\lambda$ is not smaller than 0.01 nm and not greater than 0.1 nm. By Q switching, the oscillation wavelength half value width $\Delta\lambda$ is expanded to 0.05 nm, and the above-mentioned condition is satisfied.

The repetition frequency of the pulse output of the coherent light source 21 not lower than 100 Hz and not higher than 10 kHz is desirable for a recording and reproduction device. A frequency below 100 Hz causes a transfer rate to be reduced, and it is not suitable for practical use. On the other hand, if the frequency is higher than 10 kHz, the recording output becomes insufficient. In this embodiment, the repetition frequency at pulse output of the coherent light source 21 is 1.5 kHz. With such a frequency, step recording of 20 μm can be performed at the rate of 20 mm/s.

A frequency of passive Q switch by saturable absorber 4 is preferably not lower than 1.5 kHz and not higher than 5 kHz. There is a problem that Q switch becomes unstable due to vibration relaxation frequency of a solid laser. However, passive Q switching can be performed most stably within such a range.

A pulse width of the pulse output of the coherent light source 21 is preferably not lower than 0.1 μs and not higher than 10 μs. With a pulse width of 10 μs or lower, even when the hologram recording medium 15 is being rotated, a hologram can be recorded instantly as if it is static. On the other hand, with a pulse width below 0.1 μs, total energy is insufficient for recording a hologram.

An average output when the pulse of the coherent light source 21 is output is preferably not lower than 10 mW and not higher than 200 mW. With the output below 10 mW, a rate of recording on the hologram recording medium 15 is reduced, and it is not suitable for a practical use. On the other hand, when the output is higher than 200 mW, a size of a portion for radiating heat becomes large. Thus, the coherent light source 21 cannot be mounted to an optical head portion.

The peak output of the coherent light source 21 when the pulse is output is preferably not lower than 10 W and not higher than 200 W. With the peak output below 10 W, there is no the hologram recording material which can be used sensitively. On the other hand, with the peak output higher than 200 W, an average output of the semiconductor laser 1 becomes as high as 3 W, and input power becomes 6 W. A difference of 3 W is transformed into heat and a heat is generated. Thus, the coherent light source 21 has to have a large heat radiating portion, and a small recording and reproduction device cannot be achieved.

In this embodiment, module temperature, that is, a temperature of the semiconductor laser 1 and the SHG device 2 is stabilized by Peltier element. Thus, the phase matching wavelength hardly changes, and an optical output is obtained stably.

As described above, in this embodiment, a wavelength of a fundamental wave can be the same among different recording and reproduction devices by selecting an oscillation line of Nd-added YAG by previously determining the wavelength of the fundamental wave. As a result, a wavelength can be fixed when it is applied as a light source of a device which requires an absolute wavelength, such as a hologram memory.

By employing Q switching, a spectrum fluctuation is provided. Thus, an oscillation wavelength width of the coherent light source is not affected by an extra interference at an optical system, and can be set in a range where coherence is maintained in the hologram medium.

As a result, a hologram recording medium recorded using one recording and reproduction device can be reproduced using another recording and reproduction device. An effect in practical use is significant. Further, in this embodiment, not only that energy for recording one hologram is always the same, but also, energy can be the same for recording and reproduction devices having different pulse widths and peak outputs. Compatibility among the devices can be maintained even among nonlinear hologram recording media.

In this embodiment, Cr:YAG is used as a saturable absorber. However, the saturable absorber is not limited to such an example, and a semiconductor material may also be effective. Further, an external Q switch by inserting an EO modulator may be used instead of the passive Q switch.

Figure 5:
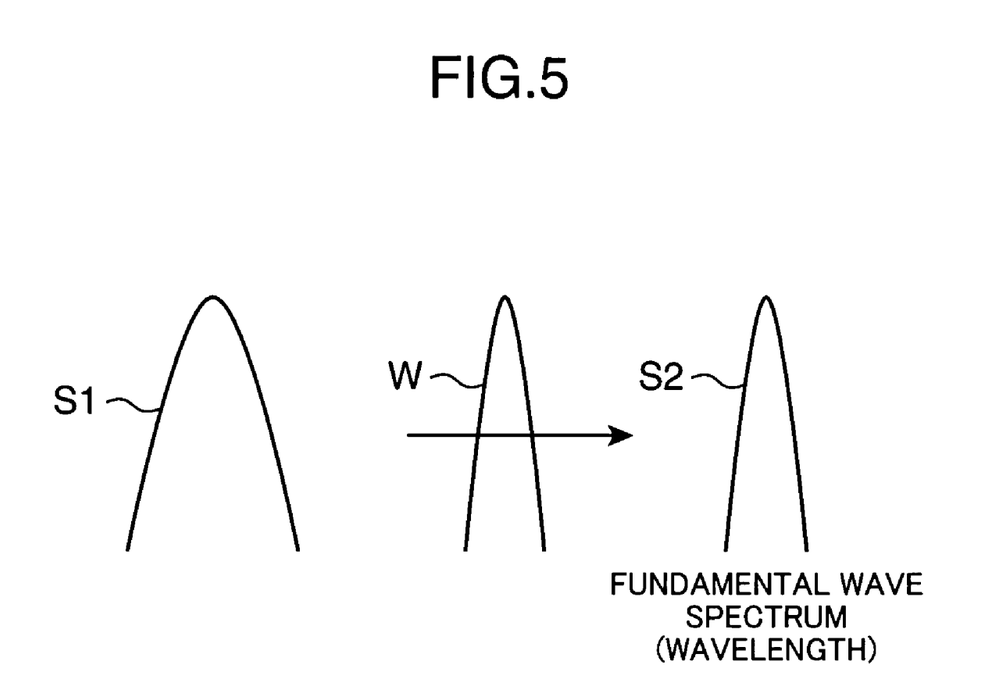
FIG. 5 is a schematic diagram for illustrating wavelength width control by SHG.

Further, in this embodiment, a wavelength width is controlled by the Q switch. However, the present invention is not particularly limited to such an example. The wavelength width may be controlled by SHG. As shown in FIG. 5, a fundamental wave spectrum (wavelength) S1 of the solid laser is transformed into a fundamental wave spectrum (wavelength) S2 with a wavelength transformation permissible width W after it passes through the SHG device. A wavelength width can be controlled arbitrary. The SHG device may be a bulk type SHG device of a pseudo phase matching mode. In the pseudo phase matching mode, periodic polarization reversed areas are used for preventing the SHG to be generated being cancelled by a direction of movement. Thus, there is a wavelength transformation permissible width for an impinging wavelength of the solid laser. The wavelength transformation permissible width is in inverse proportion to the length of the SHG device. The wavelength width can be varied by adjusting the length of the SHG device.

More specifically, the wavelength transformation permissible width of the bulk type SHG device is 0.21 nm in crystal having the length of 10 mm and is 0.07 nm in crystal having the length of 30 mm. Thus, the oscillation wavelength of the solid laser expanded to 1 nm is transformed into an oscillation wavelength having a wavelength width of 0.07 nm after it passes through an SHG device having a wavelength transformation permissible width of 0.07 nm. A coherent light source having a wavelength width of 0.07 nm can be realized. In this way, a coherent light source having a target wavelength width can be realized by an SHG device having a certain wavelength transformation permissible width.

In this embodiment, laser light emitted from the coherent light source 21 is stopped between holograms to have zero optical output for continuously recording holograms. However, the present invention is not particularly limited to such an example. It is preferable to maintain the optical output of the coherent light source 21 to a predetermined value higher than zero. In such a case, a laser spectrum of the coherent light source 21 can be stabilized, and holograms can be recorded more securely.

Figure 6:
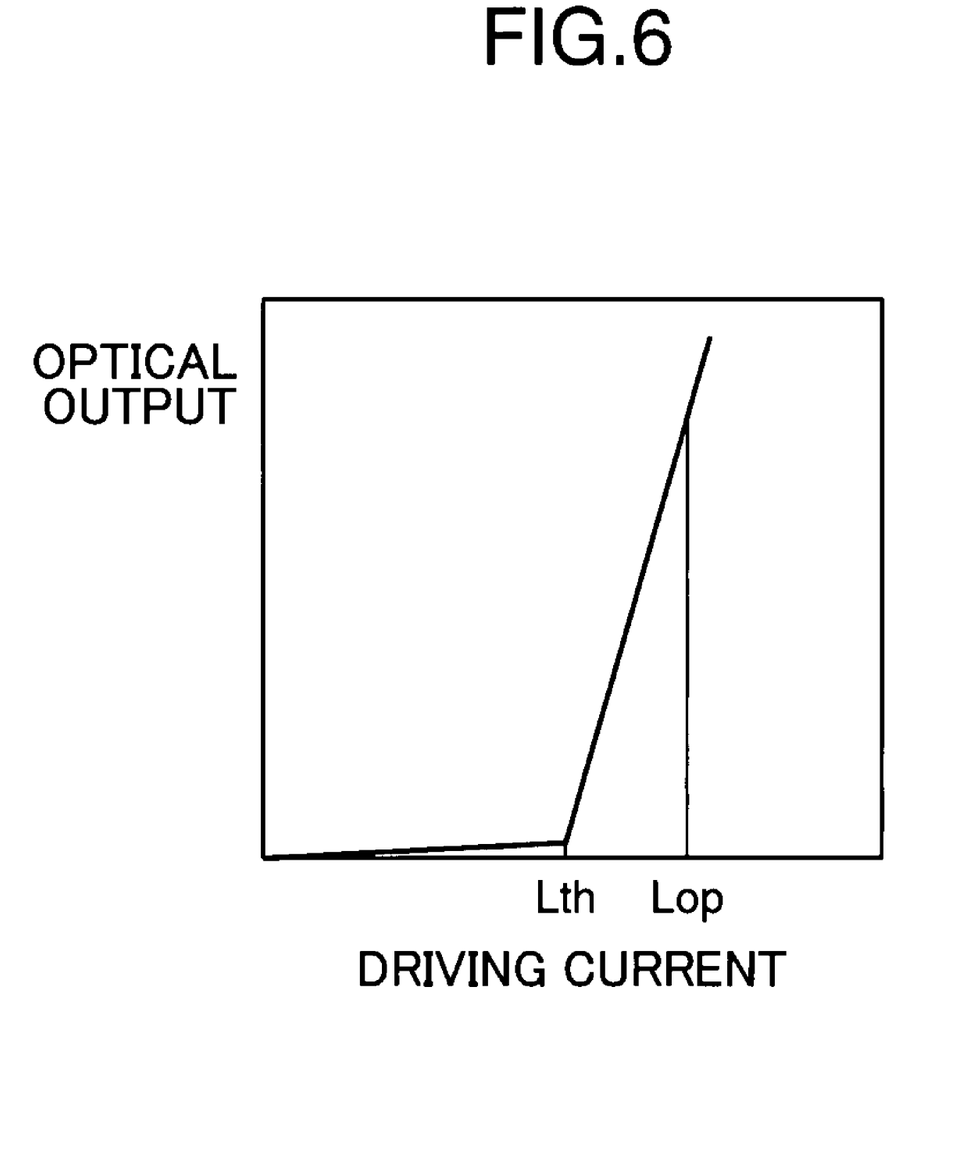
FIG. 6 is a diagram showing a relationship between an optical output of a semiconductor laser shown in FIG. 1 and a driving current.

FIG. 6 is a diagram showing the relationship between the optical output and the driving current of the semiconductor laser 1 as shown in FIG. 1. As shown in FIG. 6, the optical output of the semiconductor laser 1 has a characteristic that it increases rapidly when the driving current surpasses a threshold value Lth. When a hologram is recorded, the semiconductor laser 1 is driven by an operating current Lop. In the semiconductor laser 1 having such a characteristic, it is preferable that the semiconductor laser 1 is driven by a driving current which is not smaller than Lop/1000 and equal to Lth or a value near Lth without having zero driving current of the semiconductor laser 1. More preferably, the driving current is maintained near the threshold value Lth. In such a case, the laser spectrum of the semiconductor laser 1 is stabilized. Thus, the laser spectrum of the coherent light source 21 is stabilized, and holograms can be continuously recorded securely.

Embodiment 2

Next, a recording and reproduction device which performs pulse train recording will be described as Embodiment 2 of the present invention. A recording and reproduction device according to this embodiment includes a coherent light source, a modulator for modulating a pulse train emitted from the coherent light source, and an optical system for converging pulse light emitted from the modulator onto a hologram recording medium. A structure of Embodiment 2 is the same as that of Embodiment 1 except for the modulator. Thus, the structure will not be shown in the figures or described, and only a difference from Embodiment 1 will be described below in detail.

In the recording and reproduction device of this embodiment, an independent hologram is recorded by a plurality of light pulses. For example, one hologram is recorded with 4 pulses. Then, the pulse number is changed in the following multiplex recording. It is difficult to increase output of laser beam in SHG which employs a solid laser. If a laser beam is subjected to single modulation and is switched by an AO modulator, a recording energy can be varied easily.

Figure 7:
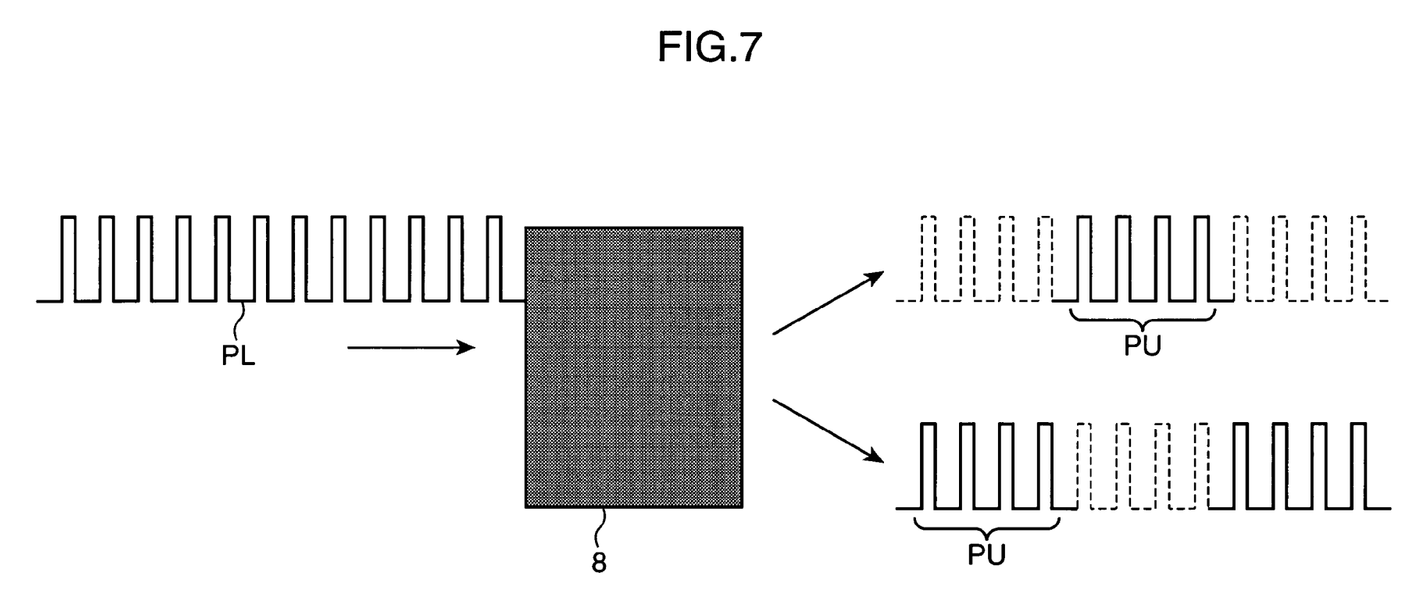
FIG. 7 is a schematic diagram illustrating pulse recording of a recording and reproduction device according to Embodiment 2 of the present invention.

FIG. 7 is a schematic diagram showing pulse recording of the recording and reproduction device according to Embodiment 2 of the present invention. As shown in FIG. 7, an AO modulator is used as a modulator 8. The modulator 8 is provided behind the mirror 5 shown in FIG. 1. The modulator 8 modulates a pulse train PL transmitted through the mirror 5 and outputs to the beam expander 22 shown in FIG. 3. The modulator 8 allows rapid modulation up to 200 MHz. Thus, the pulse number can be freely selected. In this embodiment, diffraction light which has better extinct ratio is used. The modulator 8 selects pulse train PU for one hologram which includes four pulses as one set from pulse trains PL and irradiates a hologram. An angle is changed, and next pulse train PU for one hologram including four pulses is selected. Of course, it is also possible to change the position first, and then select the pulse.

In general, when multiplicity of the hologram recording medium increases, energy has to be increased. Thus, it is important to increase the pulse number. Since the pulse train is a single pulse train with constant repetition time, it is effective to alter the rotation rate of the hologram recording medium in association with increase. Particularly, in shift multiplex recording, there is a significant effect in rendering the rate variable during an initial period of writing when multiplicity changes, and having a constant rate in an area where multiplicity is constant.

As described above, in this embodiment, one hologram is recorded with a plurality of pulses. Thus, even when the power of the coherent light source is small, a recording energy for one hologram can be increased. Multiplex recording of holograms can be performed securely. Further, the modulator 8 can select and output any number of pulses as a pulse train for one hologram. Thus, power can be changed by changing the pulse number. Holograms can be securely recorded on various types of hologram recording medium with different sensitivities.

Embodiment 3

In Embodiments 1 and 2, the coherent light source performs pulse operation. In this embodiment, the coherent light source performs continuous wave (CW) oscillation operation. The structure of the recording and reproduction device according to this embodiment is the same as that of Embodiment 1. Thus, it is not shown in a figure and is not described. Only differences from Embodiment 1 will be described below in detail.

For the coherent light source used in this embodiment, Nd:YVO4 is employed as a solid laser and KTP crystal is used as a wavelength transformation element. A wavelength of the coherent light source is 532.1 nm, and recording is performed with speckle multiplex mode. As a result, 500 GB can be recorded. This means that the same effect as that of Embodiment 1 can be achieved by this embodiment.

In this embodiment, an output of the coherent light source is 200 mW. The output may have any value as long as it is not lower than 10 mW and not higher than 200 mW. When the output is higher than 200 mW, a size of a portion for radiating heat becomes large and the coherent light source cannot be mounted to an optical head portion. On the other hand, with an output below 10 mW, a rate of recording to the hologram recording medium is reduced, and it is not suitable for a practical use.

Embodiment 4

Figure 8:
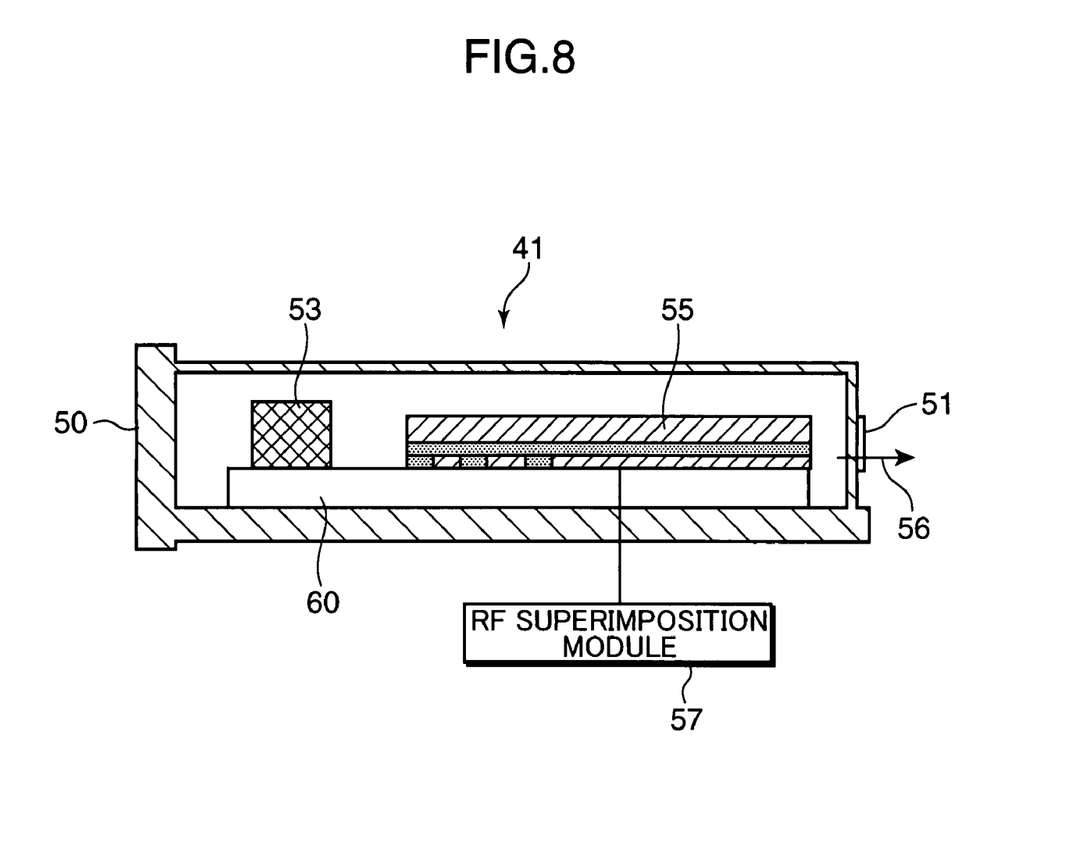
FIG. 8 is a cross-sectional view showing a structure of a coherent light source used in a recording and reproduction device according to Embodiment 4 of the present invention.

Next, a structure for performing hologram recording and reproduction using a semiconductor laser is described as Embodiment 4. FIG. 8 is a schematic diagram showing a structure of a coherent light source used for a recording and reproduction device according to Embodiment 4 of the present invention.

In a coherent light source 41 shown in FIG. 8, a GaN wavelength-variable DBR semiconductor laser with output of 100 mW and wavelength of 407 nm, which includes an active layer area, a DBR area, and a phase adjustment area is used as a semiconductor laser 55. By injecting a current into the DBR area and the phase adjustment area at a constant ratio, a wavelength of fundamental wave light can be varied.

By controlling an amount of current flowing to the DBR area and the phase adjustment area by the semiconductor laser (wavelength-variable DBR semiconductor laser) 55 with a laser output of 100 mW, an oscillation wavelength can be modified and a wavelength is fixed to 407 nm. A wavelength of 407 nm is detected by a detector 53. The detector 53 includes a diffraction grating and a photo diode, and can detect a certain wavelength.

Figure 9:
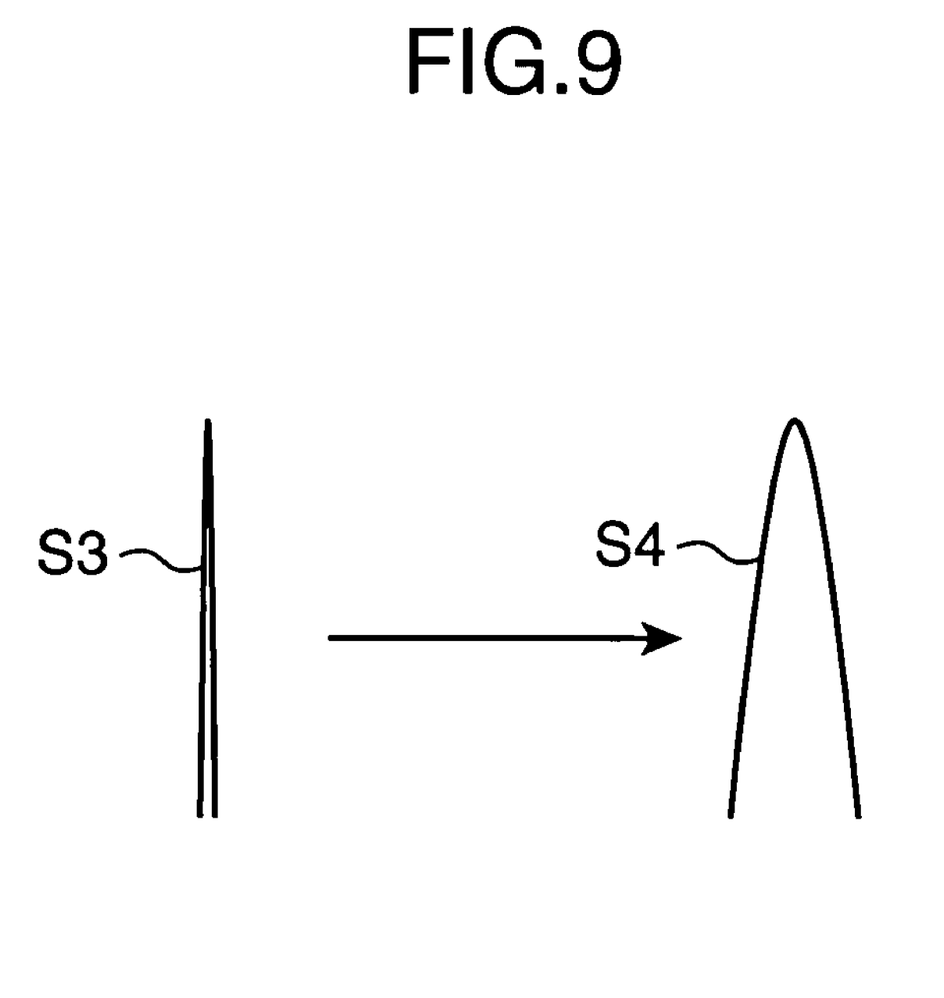
FIG. 9 is a schematic diagram for illustrating wavelength width control by RF superimposition.

Further, a high frequency signal is applied to the semiconductor laser 55 by an RF superimposition module 57 to perform RF superimposition. As shown in FIG. 9, a wavelength width of laser spectrum (wavelength) S3 at CW is expanded to obtain laser spectrum (wavelength) S4 at RF superimposition. Spectrum of oscillation is expanded. In this embodiment, a wavelength half value width of the oscillation laser light is 0.05 nm.

The semiconductor laser 55 and the detector 53 are fixed on a sub-mount 60. They are incorporated into a package 50. Laser light 56 with a wavelength of 407 nm passes through and is taken outside from a window 51 of the package 50.

Next, a recording and reproduction device of this embodiment will be described. The recording and reproduction device uses the coherent light source 41 shown in FIG. 8 as the laser light source, and uses an optical disc optical system of an angular multiplex recording mode. The structure of the recording and reproduction device is basically similar to that of Embodiment 1. However, there is a difference in performing angular multiplex with the optical system being tilted. Since other points are the same as those in Embodiment 1, they are not shown in a figure or described. Only a difference from Embodiment 1 will be described below in detail.

In this embodiment, a hologram medium having a thickness of about 1.5 mm is used. When NA of the reference light is 0.6, multiplex of the hologram can be realized at an interval of about 15 μm. The realized recording density is 300 Gbits/inch$^2$. This is 400 GB when it is converted to the capacity of a 12 cm disc.

For performing hologram recording and reproduction, it is preferable that the oscillation wavelength half value width LX of the coherent light source 41 has the relationship which satisfies $\Delta\lambda < \lambda^2/(S \times 2 \sin\theta)$, when a substantial hologram size is S, a substantial cross angle of the reference light and the signal light is θ and the oscillation wavelength of the coherent light source 41 is λ. In this embodiment, the hologram size S is 3 mm, the wavelength λ is 407 nm, and the cross angle θ is 30 degrees. Thus, the oscillation wavelength half value width Δλ has to be 0.06 nm or shorter.

On the other hand, when an optical path length of the hologram recording optical system is t, a coherent light source which satisfies $\Delta\lambda > \lambda^2/2t$ is effective. In such a case, unnecessary interference fringe due to unnecessarily reflected light is not generated. A signal can be reproduced with a few noises. Further, it is no longer necessary to use special large equipment such as an anti-shaking mount. Thus, a small recording and reproduction device can be achieved. In this embodiment, the optical path length of the hologram recording optical system is 5 mm. Thus, the oscillation wavelength half value width Δλ is 0.03 nm or greater.

Two conditions as mentioned above show that, in this embodiment, the oscillation wavelength half value width Δλ is not shorter than 0.03 nm and not greater than 0.06 nm. By RF superimposition to the semiconductor laser 55, the oscillation wavelength half value width $\Delta\lambda$ becomes 0.05 nm, and the above-mentioned condition is satisfied.

In this embodiment, the oscillation wavelength is 407 nm. However, the present invention is not limited to such an example. As the coherent light source, a semiconductor laser with an oscillation wavelength being subjected to wavelength lock so as not to be lower than 403 nm and higher than 415 nm is preferable. Particularly, when In is added to lengthen the oscillation wavelength in a GaN semiconductor laser, crystallizability deteriorates and a threshold for oscillation rises, causing the property to deteriorate. However, if the wavelength is not higher than 415 nm, the reliability and the property are good. On the other hand, with a frequency below 403 nm, energy becomes large, causing undesirable deterioration and attachment of organic substances to optical components used for hologram recording and reproduction.

In this embodiment, the output of the coherent light source 41 is 100 mW. However, the output is not limited to such an example, and may have any figure not lower than 10 mW and not higher than 200 mW. When the output is higher than 200 mW, a short side of a GaN active layer deteriorates in a laser of a single mode oscillation, and a life cannot be secured. On the other hand, with an output below 10 mW, a rate of recording to the hologram recording medium is reduced, and it is not suitable for a practical use.

In the coherent light sources described above, the coherent light sources can be operated and a wavelength of a fundamental wave can be the same among different recording and reproduction devices by previously determining the wavelength of the fundamental wave. As a result, a wavelength can be fixed when they are applied as light sources of a device which requires an absolute wavelength, such as a hologram memory. Further, by employing SHG, Q switching, RF superimposition, oscillation wavelength width of the coherent light source is not affected by a noise due to extra interference in the optical system, and can be set to an area where the coherency in the hologram medium is maintained.

As a result, in the above embodiments, a hologram recording medium recorded using one recording and reproduction device can be reproduced using another recording and reproduction device. An effect in practical use is significant. Not only that energy for recording one hologram is always the same, but also, energy can be the same for recording and reproduction devices having different pulse widths and peak outputs. Compatibility among the devices can be maintained even among nonlinear hologram recording media.

A coherent light source according to one aspect of the present invention has an oscillation wavelength half value width $\Delta\lambda$ of a coherent light source which satisfies a relationship of $\Delta\lambda > \lambda^2/2t$ for performing recording or reproduction of a hologram, when an optical path length of a hologram recording optical system is t, and an oscillation wavelength of the coherent light source is $\lambda$.

In such a coherent light source, even when stray light is generated, holograms can be stably recorded and reproduced with generation of unnecessary interference fringe due to the stray light being suppressed.

It is preferable that the oscillation wavelength half value width $\Delta\lambda$ further satisfies a relationship of $\Delta\lambda < \lambda^2/(S \times 2 \sin\theta)$, when a substantial hologram size is S, a substantial cross angle between reference light and signal light is $\theta$, and the oscillation wavelength of the coherent light source is $\lambda$.

In this way, interference fringe of the signal light and the reference light can be recorded stably. Further, unnecessary interference fringe is not generated due to unnecessarily reflected light. Thus, holograms can be stably recorded and reproduced.

A coherent light source according to another aspect of the present invention has an oscillation wavelength half value width $\Delta\lambda$ of a coherent light source which satisfies a relationship of $\Delta\lambda < \lambda^2/(S \times 2 \sin\theta)$, when a substantial hologram size is S, a substantial cross angle between reference light and signal light is $\theta$, and an oscillation wavelength of the coherent light source is $\lambda$.

In such a coherent light source, interference fringe of the signal light and the reference light can be recorded stably. Thus, holograms can be recorded and reproduced securely.

A recording and reproduction device according to another aspect of the present invention includes a coherent light source according to any one of the above-described coherent light sources and an optical system for converging light emitted from the coherent light source on a hologram recording medium.

In such a recording and reproduction device, unnecessary interference fringe is not generated due to unnecessarily reflected light, and a signal can be reproduced with few noises. Further, special equipment of a large size such as a shock-resistant table is not used, and a small recording and reproduction device can be achieved.

An oscillation wavelength of the coherent light source is preferably 532.1 nm. In such a case, the oscillation wavelength can be the same among different recording and reproduction devices. Thus, compatibility among the devices can be maintained even among nonlinear hologram recording media.

The coherent light source preferably controls a wavelength width by a Q switch. In such a case, since the wavelength width is controlled by the Q switch, the oscillation wavelength width of the coherent light source is not affected by a noise due to extra interference in the optical system, and can be set to an area where the coherency in the hologram medium is maintained. Compatibility among the devices can be maintained even among nonlinear hologram recording media.

The coherent light source may control a wavelength width by SHG. In such a case, since the wavelength width is controlled by the SHG, the oscillation wavelength width of the coherent light source is not affected by a noise due to extra interference in the optical system, and can be set to an area where the coherency in the hologram medium is maintained. Compatibility among the devices can be maintained even among nonlinear hologram recording media.

The coherent light source preferably includes a semiconductor laser having an oscillation wavelength subjected to wavelength lock so as to be not lower than 403 nm and not higher than 415 nm. In such a case, the oscillation wavelength can be the same among different recording and reproduction devices. Thus, compatibility among the devices can be maintained even among nonlinear hologram recording media.

The coherent light source preferably controls a wavelength width by RF superimposition. In such a case, since the wavelength width is controlled by the RF superimposition, the oscillation wavelength width of the coherent light source is not affected by a noise due to extra interference in the optical system, and can be set to an area where the coherency in the hologram medium is maintained. Compatibility among the devices can be maintained even among nonlinear hologram recording media.

The semiconductor laser is preferably a DBR semiconductor laser. In such a case, by changing electrical currents flowing into the phase adjustment area and the DBR area at the same time, an oscillation wavelength can be changed continuously.

An average output of the coherent light source is preferably not lower than 10 mW and not higher than 200 mW. With the output below 10 mW, a rate of recording on the hologram recording medium is reduced, and it is not suitable for a practical use. On the other hand, when the output is higher than 200 mW, a size of a portion for radiating heat becomes large. Thus, the coherent light source 21 cannot be mounted to an optical head portion.

A peak output of the coherent light source when a pulse is output is preferably not lower than 10 W and not higher than 200 W. With the peak output below 10 W, there is no the hologram recording material which can be used sensitively. On the other hand, with the peak output higher than 200 W, the size of the coherent light source 21 becomes large including a heat radiating portion, and a small recording and reproduction device cannot be achieved.

A repetition frequency of the coherent light source when a pulse is output is preferably not lower than 100 Hz and not higher than 10 kHz. A frequency below 100 Hz causes a transfer rate to be reduced, and it is not suitable for practical use. On the other hand, if the frequency is higher than 10 kHz, the recording output becomes insufficient.

The coherent light source preferably controls a wavelength width by a Q switch, and a repetition frequency of the coherent light source when a pulse is output is preferably not lower than 1.5 kHz and not higher than 5 kHz. In such a case, passive Q switching can be performed stably.

A pulse width of a pulse output of the coherent light source is preferably not shorter than 0.1 μs and not greater than 10 μs. With a pulse width of 10 μs or lower, even when the hologram recording medium is being rotated, a hologram can be recorded instantly as if it is static. On the other hand, with a pulse width below 0.1 μs, total energy is insufficient for recording a hologram.

The coherent light source preferably outputs pulse light, and one independent hologram is preferably recorded with a plurality of pulse light output from the coherent light source. In such a case, even when the power of the coherent light source is small, a recording energy for one hologram can be increased. Multiplex recording of holograms can be performed securely.

The coherent light source preferably maintains an optical output at a predetermined value higher than 0 for stopping emitted light between holograms. In such a case, the spectrum of the coherent light source can be stabilized, and holograms can be recorded more securely.

INDUSTRIAL APPLICABILITY

The present invention provides a short wavelength coherent light source with a constant light source wavelength and an optimal wavelength width, and a compatible recording and reproduction device using the same, and thus, the present invention is industrially applicable.

The invention claimed is:

1. A coherent light source, having an oscillation wavelength half value width $\Delta\lambda$ of the coherent light source which satisfies a relationship of $\Delta\lambda > \lambda^2/2t$ for performing recording or reproduction of a hologram, wherein an optical path length of a hologram recording optical system is t, and the oscillation wavelength of the coherent light source is $\lambda$.

2. A coherent light source according to claim 1, wherein the oscillation wavelength half value width $\Delta\lambda$ further satisfies a relationship of $\Delta\lambda < \lambda^2/(S \times 2 \sin \theta)$, wherein a substantial hologram size is S, and a substantial cross angle between reference light and signal light emitted from the hologram recording optical system is $\theta$.

3. A coherent light source, having an oscillation wavelength half value width $\Delta\lambda$ of the coherent light source which satisfies a relationship of $\Delta\lambda < \lambda^2/(S \times 2 \sin \theta)$, wherein a substantial hologram size is S, a substantial cross angle between reference light and signal light emitted from the hologram recording optical system is $\theta$, and the oscillation wavelength of the coherent light source is $\lambda$.

4. A recording and reproduction device, comprising:
a coherent light source according to claim 1; and
an optical system for converging light emitted from the coherent light source on a hologram recording medium.

5. A recording and reproduction device according to claim 4, wherein the oscillation wavelength of the coherent light source is 532.1 nm.

6. A recording and reproduction device according to claim 5, wherein the coherent light source controls a width of the oscillation wavelength by a Q switch.

7. A recording and reproduction device according to claim 5, wherein the coherent light source controls a width of the oscillation wavelength by SHG.

8. A recording and reproduction device according to claim 1, wherein the coherent light source includes a semiconductor laser having the oscillation wavelength subjected to wavelength lock so as to be not lower than 403 nm and not higher than 415 nm.

9. A recording and reproduction device according to claim 8, wherein the coherent light source controls a width of the oscillation wavelength by RF superimposition.

10. A recording and reproduction device according to claim 8, wherein the semiconductor laser is a DBR semiconductor laser.

11. A recording and reproduction device according to claim 5, wherein an average power of light emitted from the coherent light source is not lower than 10 mW and not higher than 200 mW.

12. A recording and reproduction device according to claim 5, wherein a peak power of light emitted from the coherent light source when a pulse is output is not lower than 10 W and not higher than 200 W.

13. A recording and reproduction device according to claim 5, wherein a repetition frequency of the coherent light source when a pulse is output is not lower than 100 Hz and not higher than 10 kHz.

14. A recording and reproduction device according to claim 5, wherein:
the coherent light source controls a width of the oscillation wavelength by a Q switch; and
a repetition frequency of the coherent light source when a pulse is output is not lower than 1.5 kHz and not higher than 5 kHz.

15. A recording and reproduction device according to claim 5, wherein a pulse width of a pulse output of the coherent light source is not shorter than 0.1 and not greater than 10 μs.

16. A recording and reproduction device according to claim 4, wherein:
the coherent light source outputs pulse light; and
one independent hologram is recorded with a plurality of pulse light output from the coherent light source as the hologram.

17. A recording and reproduction device according to claim 4, wherein the coherent light source maintains an optical output at a predetermined value higher than 0 for stopping emitted light between holograms.

* * * * *